United States Patent [19]
Rao et al.

[11] Patent Number: 5,159,428
[45] Date of Patent: Oct. 27, 1992

[54] SIDEWALL-SEALED POLY-BUFFERED LOCOS ISOLATION

[75] Inventors: Kalipatnam V. Rao, Plano; Joel T. Tomlin, Garland; Monica A. Beals, Dallas, all of Tex.

[73] Assignee: Texas Instruments Incorporated, Dallas, Tex.

[21] Appl. No.: 622,698

[22] Filed: Dec. 5, 1990

Related U.S. Application Data

[60] Division of Ser. No. 552,279, Jul. 12, 1990, which is a continuation of Ser. No. 244,968, Sep. 15, 1988.

[51] Int. Cl.⁵ .............................................. H01L 27/12
[52] U.S. Cl. ...................................... 357/49; 357/47; 357/55; 357/54
[58] Field of Search ...................... 357/49, 50, 54, 55, 357/47, 54 N; 437/69, 70

[56] References Cited

U.S. PATENT DOCUMENTS

| | | | |
|---|---|---|---|
| 4,376,336 | 3/1983 | Endo et al. | 437/70 |
| 4,758,530 | 7/1988 | Schubert | 437/69 |
| 4,897,364 | 1/1990 | Nguyen et al. | 357/49 |
| 4,956,692 | 9/1990 | Ozaki et al. | 357/49 |
| 5,043,778 | 8/1991 | Teng et al | 357/49 |

Primary Examiner—William Mintel
Assistant Examiner—Roy Potter
Attorney, Agent, or Firm—Richard A. Stoltz; Richard L. Donaldson; Jay Cantor

[57] ABSTRACT

This is a semiconductor device, comprising: a semiconductor body having an isolation region separating at least two active device regions; pad oxide layers disposed on said active regions; polysilicon layers disposed on said pad oxide layers; silicon nitride layers disposed on said polysilicon layers; and a sidewall seal disposed all along the perimeter of the active device regions to seal said active device regions against oxygen diffusion. The resulting field oxide isolation region has reduced oxide encroachment into the active moat region.

3 Claims, 3 Drawing Sheets

SIDEWALL-SEALED POLY-BUFFERED LOCOS ISOLATION

This is a division, of application Ser. No. 552,279, filed Jul. 12, 1990 which was a continuation of application Ser. No. 07/244,968, filed Sept. 15, 1988.

BACKGROUND OF THE INVENTION

The present invention relates generally to semiconductor isolation methods and regions and relates more particularly to sidewall-sealed poly-buffered LOCOS isolation (SSPBL) regions and methods for forming same.

The conventional Local Oxidation of Silicon (LOCOS) method for forming semiconductor isolation regions has become a mainstay in the semiconductor technology due in part to the ease of its implementation in process flows. This oxidation method however leads to excessive lateral encroachment of the oxide into the desired active moat region. This encroachment is presently termed bird's beaking and is the cause of numerous and significant detriments to the semiconductor active region, thus leading to a reduction of the available active region. This is costly in terms of device yield and reliability.

Many isolation techniques have been developed for reducing the amount of encroachment associated with the standard LOCOS process. Examples of these are the Poly-Buffered LOCOS (PBL) method which utilizes a poly-silicon layer disposed between the pad silicon dioxide and silicon nitride layers of the conventional LOCOS process; the sidewall masked isolation (SWAMI) method which uses a silicon etch and sidewall silicon nitride layer to suppress teh field oxide bird's beak; the modified fully-framed-fully-recessed (MF3R) isolation method which uses an oxide undercut and backfill; and numerous modifications to these processes. However, the above solutions have either lead to a new set of problems, such as silicon pitting in the active moat regions, and crusting and scalloping along the moat edges, or have failed to correct the initial problem of excessive encroachment and corner loss. In addition, some of these isolation techniques are somewhat complicated and involve many process steps.

Thus a need exists in the technology for a semiconductor isolation process which corrects the above noted problems without degrading the performance or the useful area of the active region.

SUMMARY OF THE INVENTION

In accordance with the teaching of the present invention, the disclosed sidewall-sealed poly buffered LOCOS process reduces or eliminates the disadvantages and shortcomings associated with relevant prior art methods for forming localized isolation regions for VLSI technology. Briefly, according to the present invention; a pad silicon dioxide layer is formed on a semiconductor body; a polysilicon layer is thereafter formed on the pad oxide layer; a silicon nitride layer is thereafter formed on said polysilicon layer; next, the isolation regions are defined by photolithography, plasma etch and channel stop implant steps; and thereafter a nitride sidewall seal is formed around the perimeter of the semiconductor regions, followed by field oxidation to grow the isolation oxide.

In a preferred embodiment a pad oxide buffer is disposed between the nitride sidewall and the semiconductor body.

BRIEF DESCRIPTION OF THE DRAWINGS

Further features and advantages will become apparent from the following and more particular description of the various embodiments of the invention, as illustrated in the accompanying drawing, wherein.

DETAILED DESCRIPTION OF THE PREFERRED EMBODIMENTS

Figure 1:
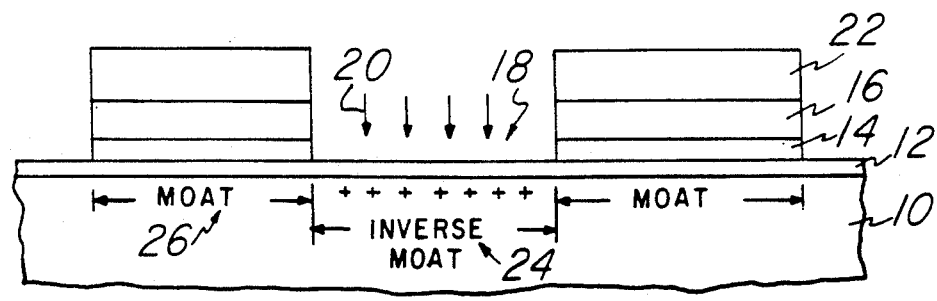
FIG. 1, is a cross-sectional view of a wafer iullustrating a formation step of the present isolation and active device regions.

Referring now to the drawings, wherein like reference characters designate like or corresponding parts throughout the several views, FIG. 1 illustrates a resultant intermediate structure in accordance with a preferred embodiment of the present invention. As shown in FIG. 1, A 12–15 nanometer pad silicon dioxide layer 12 is grown on a conventional silicon semiconductor substrate or body 10. Subsequently a polysilicon buffer layer 14 is deposited over the pad oxide by low-pressure chemical vapor deposition to approximately 50 nanometers. Thereafter a 240 nanometers silicon nitride layer 16 is deposited over the polysilicon layer by low-pressure chemical vapor deposition. Next an inverse-moat region 18 is patterned in accordance with standard lithographic techniques; the area beneath the non-exposed photoresist defines the active device moat region. The nitride and polysilicon over the inverse-moat region 24 are thereafter plasma etched to expose the pad oide, as shown. Next, a boron channel-stop implant 20 is performed in the inverse-moat region 18. The photoresist 22 is thereafter removed by a plasma-ash, piranha-strip and pre-furnance clean-up.

Figure 2:
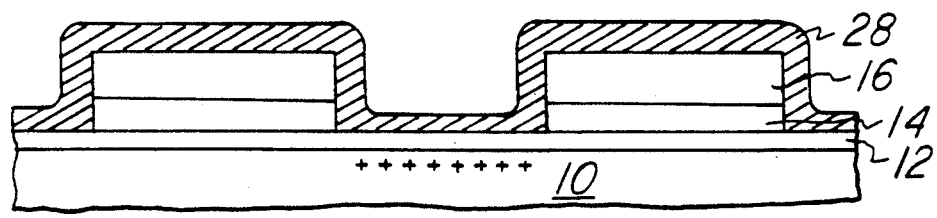
FIG. 2 is a cross-sectional view of the wafer after semiconductor material has been disposed on the wafer for formation of a sidewall seal.
Figure 3:
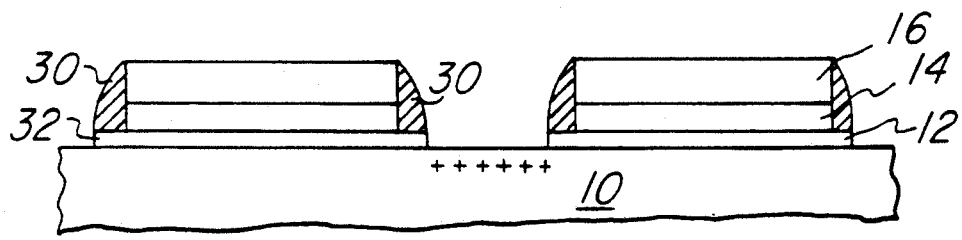
FIG. 3 is a cross-sectional view of the wafer after the sidewall seal has been formed.

Referring now to FIG. 2, a 30–90 nanometer layer of silicon nitride 28 is shown deposited over the wafer by low-pressure chemical-vapor deposition. The wafer is thereafter subjected to an anisotropic blanket etch. This step etches away the silicon nitride and pad oxide in the inverse moat regions, leaving a thin 30–90 nanometer silicon nitride sidewall seal 30 along the perimeter of the moat region 26. The nitride sidewall seals the moat edges considerably from oxygen diffusion during formation of the isolation field oxide 34 (FIG. 4) in the inverse moat region. The sealing of the moat region substantially reduces the amount of oxide encroachment associated with conventional LOCOS processing. As shown in FIG. 3, the anisotropic etch results in a pad oxide edge 32 remaining beneath the nitride sidewall which aids in relieving any stresses in the underlying silicon during the formation of the isolation field oxide.

The isolation field oxide 34 is grown to approximately 800 to 850 nanometers in accordance with the present method, by subjecting the wafer to a high-pressure, approximately 10 Atm., oxidation at an elevated temperature of approximately 975 C. This combination of pressure and temperature aids to minimize encroachment and deter the spreading of the channel-stop implant into the active moat regions. Conventional steam oxidation at 900 C. may also be used in accordance with the present invention, if boron spreading is not a major concern.

The above sequence of steps also significantly reduces excessive encroachment (bird's beaking) at the narrow moat corners, which results from the two-dimensional oxidation of the two sides comprising a corner.

Figure 4:
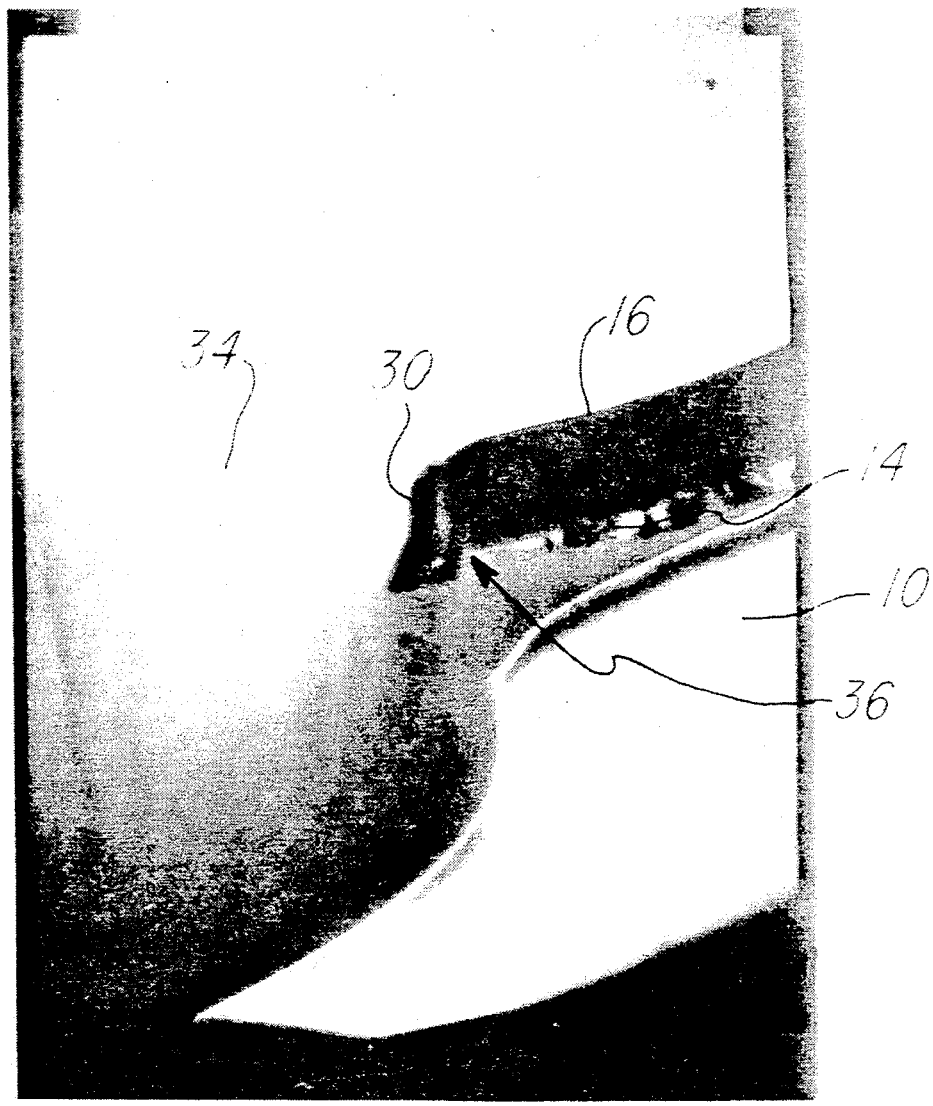
FIG. 4 is an exploded cross-sectional view of active region-isolation region intersection illustrating the reduced bird's beaking after formation of the field oxide.

Referring now to FIG. 4, there is shown an exploded illustration of the field oxide-sidewall intersection after the oxidation step. As illustrated the nitride sidewall 30 significantly reduces oxidation of the top surface 36 of the polysilicon buffer layer 14. Thus the normally occurring second bird's beak associated with conventional poly buffered LOCOS processes is all but eliminated. The elimination of this bird's beaking or encroachment is key to the successful removal of polysilicon layer 14 at the active moat edges during a subsequent high-selectivity plasma etch to expose the active moat region 26. In prior art methods the oxide on top of the polysilicon layer, comprising the second birds' beak oxide at the edges, shields the edges of the polysilicon and inhibits its removal. Thus the polysilicon over the active region is completely removed before all the edge polysilicon can be eliminated. These edge particles leave foot prints, referred to a scalloping, around the moat edges, especially at narrow moat corners where the severity of bird's beak formation is the worst.

Figure 5:
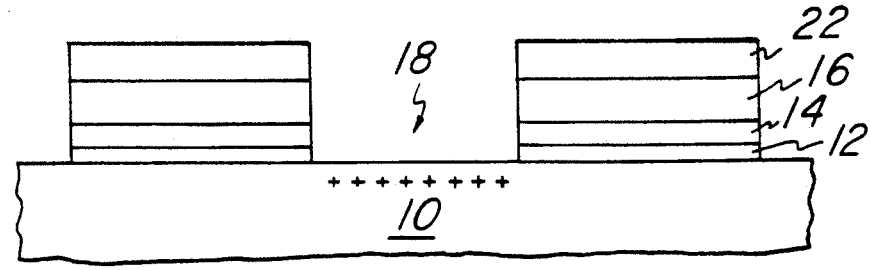
FIG. 5 is a cross-sectional view of an alternative embodiment of the FIG. 1 wafer illustrating the elimination of a pad oxide layer from the inverse moat region.

An alternative embodiment of the present invention is shown in FIG. 5. As shown, the pad oxide may be removed by plasma etching after removal of the silicon nitride and polysilicon layers. Thus the subsequent sidewall formation will not include edge portion 32 of the pad oxide depicted in FIG. 3.

In another alternative embodiment, the sidewalls may be formed from an LPCVD deposition of polysilicon or oxide films. In accordance with the teachings of the present invention, the features of the active moat regions are further improved by a novel processing sequence to expose the active moat region. As is well known in the semiconductor art, the field oxidation step is very likely to form a thin oxynitride skin over the moat nitride layer (about 17 namometers thick, following the 975C, 10 ATM. high-pressure oxidation). Prior-art processing sequences have attempted to remove this skin concurrently with the removal of the deposited nitride layer. Accordingly, prior-art methods have resulted in crusting along the edges of the active region.

This crusting further degrades the amount and quality of the active moat region. The present inventors have determined that this crusting can be eliminated by a sufficient deglazing of the wafer to strip off all of the oxynitride skin, before attempting the removal of the moat nitride layer. This can be performed by subjecting the wafer to 10% HF at room temperature for approximately 2 minutes. This long deglaze will ensure that all of the oxynitride skin following the long oxidation is removed.

Next, the moat nitride is removed by acid stripping in a hot phosphoric bath of approximately 175 to 182 C. for approximately 90 minutes. The longer etch time at this temperature, in comparison to the conventional 60 min etch of conventional PBL, will ensure that all of the moat nitride layer and the side-wall nitride are removed.

Next the wafer is subjected to a high-selectivity isotropic blanket plasma etch with SF6 gas to remove the polysilicon layer. This plasma-etch step in combination with the use of the thicker pad oxide layer helps to prevent silicon pitting (detrimental etching) of the active moat region. The use of the nitride sidewall deposition after the inverse moat oxide plasma etch further enhances the present poly-buffered LOCOS process by minimizing the first bird's beak oxide, i.e., the oxide that forms underneath the polysilicon film at the edges, due to the combined oxidation of the moat silicon and the underside of the poly buffer film at the moat-field oxide interfaces.

Next the moat pad oxide is stripped off and the wafer is subjected to a megasonic clean up to ensure that any un-oxidized and un-etched polysilicon granulites are effectively removed. The active region is now ready for the formation of the sacrificial gate oxide, Vt-adjust implant, and the subsequent gate oxidation and LPCVD polysilicon gate deposition.

Another embodiment of the present invention is to avoid the formation of any thin oxide layers between the moat polysilicon and nitride films. This can be achieved in accordance with the teachings of the present invention by avoiding any piranha or megasonic (RCA-type) $NH_4OH$-$H_2O_2$-$H_2O$ like cleanups before the inverse-moat nitride deposition or after the moat nitride strip. This prevents any excessive native oxide build-up on the top surface of the polysilicon buffer film. If there are any oxides on top of the poly film, they may not etch off during the SF6 high-selectivity polysilicon plasma-etch process, thus making it difficult to remove the underlying polysilicon film during the moat-etch sequence.

Additionally, the use of the sidewall seal priot to field oxidation aids the polysilicon etch process (during the moat etch sequence), by avoiding the second bird's beak oxide that has occurred in the prior-art on top of the poly surface around the edges. This additionally avoids any scalloping problems in the narrow moat corners which has been experienced in the prior-art conventional poly buffered LOCOS.

Typical values of the improved isolation characteristics obtainable from the present process are depicted in Table 1.

TABLE 1

| C.S. Dose (B11, 40 keV) | VTFN (V @ 1 uA) | VTFP (V @ 1 uA) | P + Moat/P + Moat Leakage @ 5 V | |
| --- | --- | --- | --- | --- |
| | | | 1.2 um space | 1.2 um with (with poly gate) |
| 5.0 E12/cm2 | 10.6 | > −20 | 35.4 pA | 40.3 pA |
| 6.0 E12/cm2 | 11.6 | > −20 | 50.4 pA | 44.6 pA |
| 7.0 E12/cm2 | 12.0 | −18.5 | 33.1 pA | 30.1 pA |

Column 1, shows various $B^{11}$ (Boron) channel stop implant doses at 40 keV. Column 2 shows the corresponding threshold voltage $V_t$ of a 1.2 $\mu$m long n-type field transistor. Column 3 shows the corresponding threshold voltage for a 1.2 $\mu$m long p-type field transistor. Columns 4 and 5 show moat to moat leakage current at $5_v$ for 1.2 $\mu$m isolation space, and 1.2 $\mu$m excellent moat to moat space with polysilicon gate, respectively. As shown the present device has characteristics over a range of channel stop dosages, for use in VLSI technology.

Figure 6:
FIG. 6 is a cross-sectional view of an isolation region formed by the present inventive process.

Referring now to FIG. 6, there is illustrated a cross-sectional view of an isolation region fabricated in accordance with the teachings of the present invention. As shown the intersection of the isolation region 24 and active moat region 26 has an abrupt intersection 40, without the usual bird's beak taper into the active moat region 26.

The values and ranges disclosed herein are given for a preferred embodiment of the present invention, of course these values may vary as the parameters are changed. Therefore it is to be understood that many changes in detail may be made as a matter of engineering choices without departing from the spirit and scope of the invention, as defined by the appended claims. For example other dopants may be used for channel stop implant. Such as a phosphorous, Germanium, Germanium/Boron. The present sidewall-sealed poly-buffered LOCOS process can be used in conjunction with Germanium/Boron channel stop implant to fabricate high-voltage VLSI devices such as EPROMS, EEPROMS.

TECHNICAL ADVANTAGES OF THE INVENTION

From the foregoing the fabrication steps of an improved poly-buffered LOCOS (PBL) isolation region has been disclosed. A technical advantage of the disclosed isolation process is that a substantial amount of the lateral encroachment generally known as Bird's Beaking has been eliminated without degrading the operational characteristics of the active region. Therefore an attendant technical advantage of the present encroachment reduction process is that it facilitates the successful fabrication of VLSI technologies with 0.8 micron or smaller design rules.

Another technical advantage of the invention presented is that detrimental processing steps which result in excessive pitting, scalloping and crusting of the active region, effects which effectively reduce the amount of usable active moat area, have been eliminated or modified. Furthermore, the excessive corner loss experienced in prior art processes due to two-dimensional oxidation has been substantially suppressed with the present invention. Thus an attendant technical advantage is that little or no unusable moat area need be compensated for in the processing sequence.

What is claimed:

1. A semiconductor device, comprising:
   a semiconductor body having an isolation region separating at least two active device regions;
   pad oxide layers disposed on said active device regions;
   polysilicon layers disposed on said pad oxide layers;
   silicon nitride layers disposed on said polysilicon layers; and
   a sidewall seal disposed all along a perimeter of the oxide layers polysilicon layers of each of the active device regions to seal said active device regions against oxygen diffusion.

2. The sidewall-sealed isolation region of claim 1, wherein said pad oxide layers include an edge portion extending partially into said isolation regions, and wherein said sidewall is further disposed over said edge portion.

3. The sidewall-sealed isolation region of claim 1 wherein said sidewall is nitride.

* * * * *